(12) United States Patent
Yun et al.

(10) Patent No.: US 11,569,106 B2
(45) Date of Patent: Jan. 31, 2023

(54) WAFER CASSETTE PACKING APPARATUS

(71) Applicant: SK SILTRON CO., LTD., Gumi-si (KR)

(72) Inventors: Tae Ju Yun, Gumi-si (KR); Chi Bok Lee, Gumi-si (KR)

(73) Assignee: SK Siltron Co., Ltd., Gumi-Si (KR)

(*) Notice: Subject to any disclaimer, the term of this patent is extended or adjusted under 35 U.S.C. 154(b) by 701 days.

(21) Appl. No.: 16/547,856

(22) Filed: Aug. 22, 2019

(65) Prior Publication Data

US 2020/0219741 A1 Jul. 9, 2020

(30) Foreign Application Priority Data

Jan. 9, 2019 (KR) .................. 10-2019-0002634

(51) Int. Cl.
*H01L 21/67* (2006.01)
*H01L 21/673* (2006.01)
*H01L 21/677* (2006.01)

(52) U.S. Cl.
CPC ...... *H01L 21/67288* (2013.01); *H01L 21/673* (2013.01); *H01L 21/6773* (2013.01); *H01L 21/67121* (2013.01)

(58) Field of Classification Search
CPC combination set(s) only.
See application file for complete search history.

(56) References Cited

U.S. PATENT DOCUMENTS

2006/0286606 A1* 12/2006 Oliver .................. G01N 1/2214
435/7.1
2009/0228408 A1* 9/2009 Kaushal ................... G06N 5/04
714/26

(Continued)

FOREIGN PATENT DOCUMENTS

CN 103863586 6/2014
CN 107490578 12/2017
(Continued)

OTHER PUBLICATIONS

Chinese Office Action dated Apr. 21, 2021 issued in Application No. 201910961882.0 (English translation attached).

(Continued)

*Primary Examiner* — Mohammed Shamsuzzaman
(74) *Attorney, Agent, or Firm* — KED & Associates, LLP

(57) ABSTRACT

The present invention provides an apparatus for packing wafer cassettes, the apparatus including: a loading part to which a wafer cassette is loaded; an accessory inspecting part configured to check a recipe attached to the wafer cassette and inspect accessories of the wafer cassette; a first label attaching part configured to attach a first label to the wafer cassette on which the accessory inspection has been completed; a primary film packing part configured to receive a primary film according to the recipe and pack the wafer cassette using the primary film; a secondary film packing part configured to receive a secondary film according to the recipe and secondarily pack the wafer cassette using the secondary film; a second label attaching part configured to attach a second label to the secondary film with which the wafer cassette has been packed; and an unloading part configured to discharge the wafer cassette which has been completely packaged.

8 Claims, 12 Drawing Sheets

(56) References Cited

U.S. PATENT DOCUMENTS

| | | | | |
|---|---|---|---|---|
| 2009/0240366 A1* | 9/2009 | Kaushal | ............... | G06N 20/00 |
| | | | | 700/110 |
| 2010/0138026 A1* | 6/2010 | Kaushal | ................ | G06N 5/04 |
| | | | | 706/23 |
| 2012/0252709 A1* | 10/2012 | Felts | ................ | A61M 5/3129 |
| | | | | 508/100 |

FOREIGN PATENT DOCUMENTS

| | | | | |
|---|---|---|---|---|
| JP | H11-198987 | 7/1999 | | |
| JP | 2003-300509 | 10/2003 | | |
| JP | 2015-058958 | 3/2015 | | |
| JP | 2017-047934 | 3/2017 | | |
| KR | 10-2000-0009255 | 2/2000 | | |
| KR | 10-2000-0013413 | 3/2000 | | |
| KR | 10-2005-0121451 | 12/2005 | | |
| KR | 10-0906294 | 7/2009 | | |
| WO | WO-2004019387 A1 * | 3/2004 | ....... | H01L 21/67778 |
| WO | WO-2006115466 A1 * | 11/2006 | ........... | B28D 5/0082 |

OTHER PUBLICATIONS

Japanese Office Action dated Oct. 20, 2020 issued in Application No. 2019-155318.
Korean Office Action dated Jan. 29, 2020 issued in Application No. 10-2019-0002634.

* cited by examiner

[FIG.1]
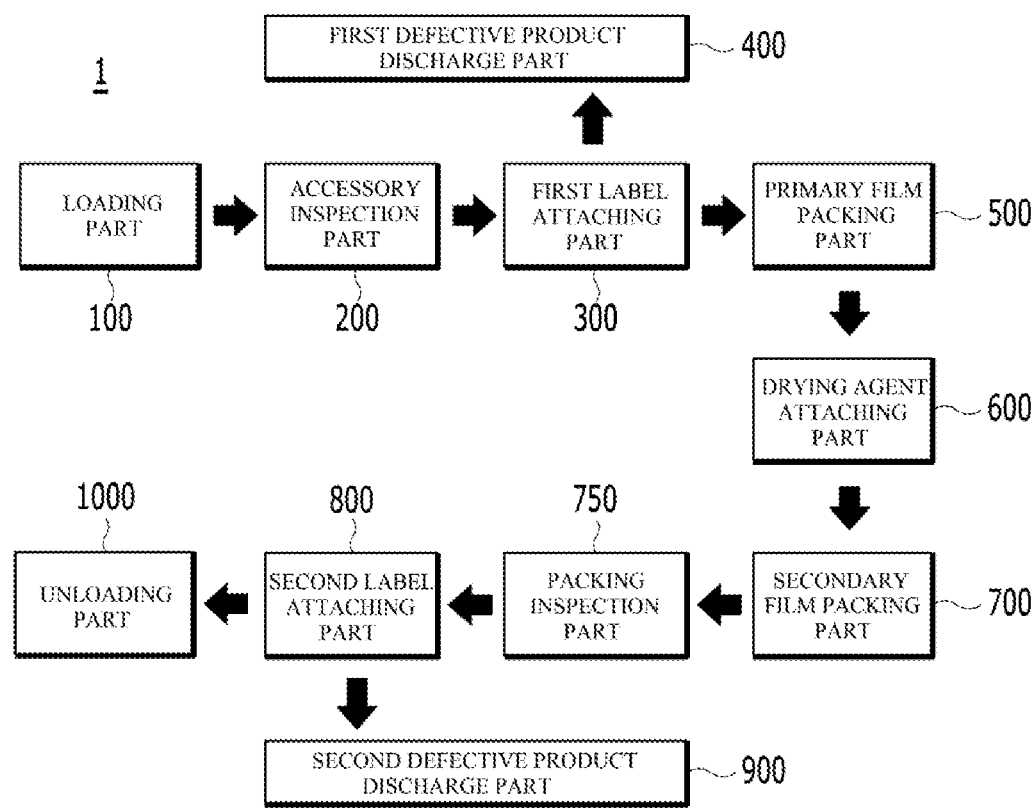

[FIG.2]
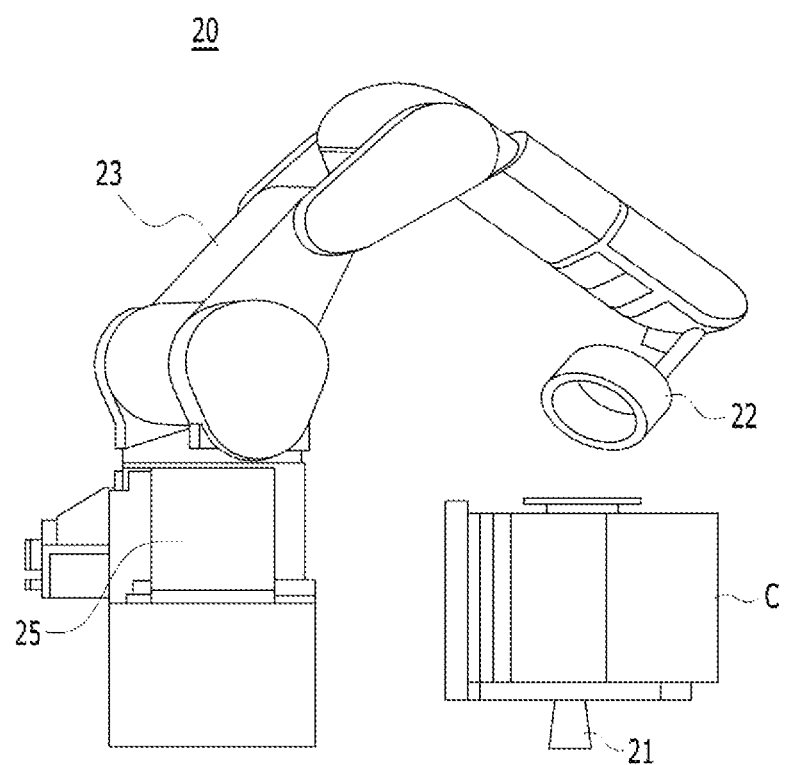

[FIG.3]
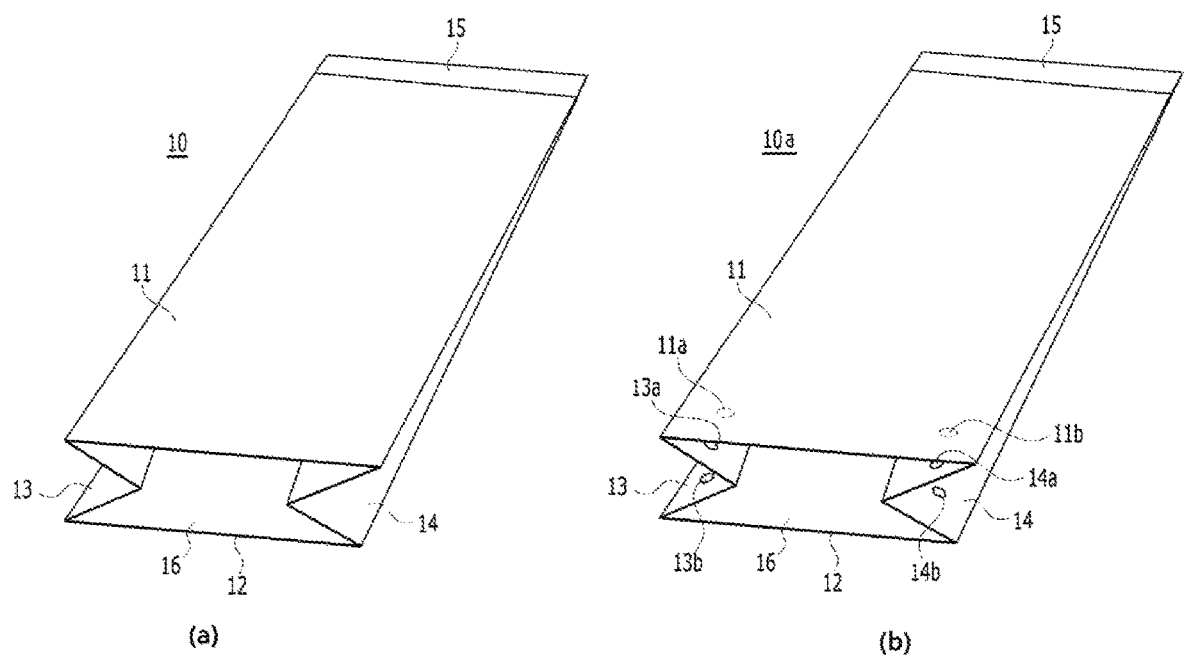
(a)   (b)

[FIG.4]
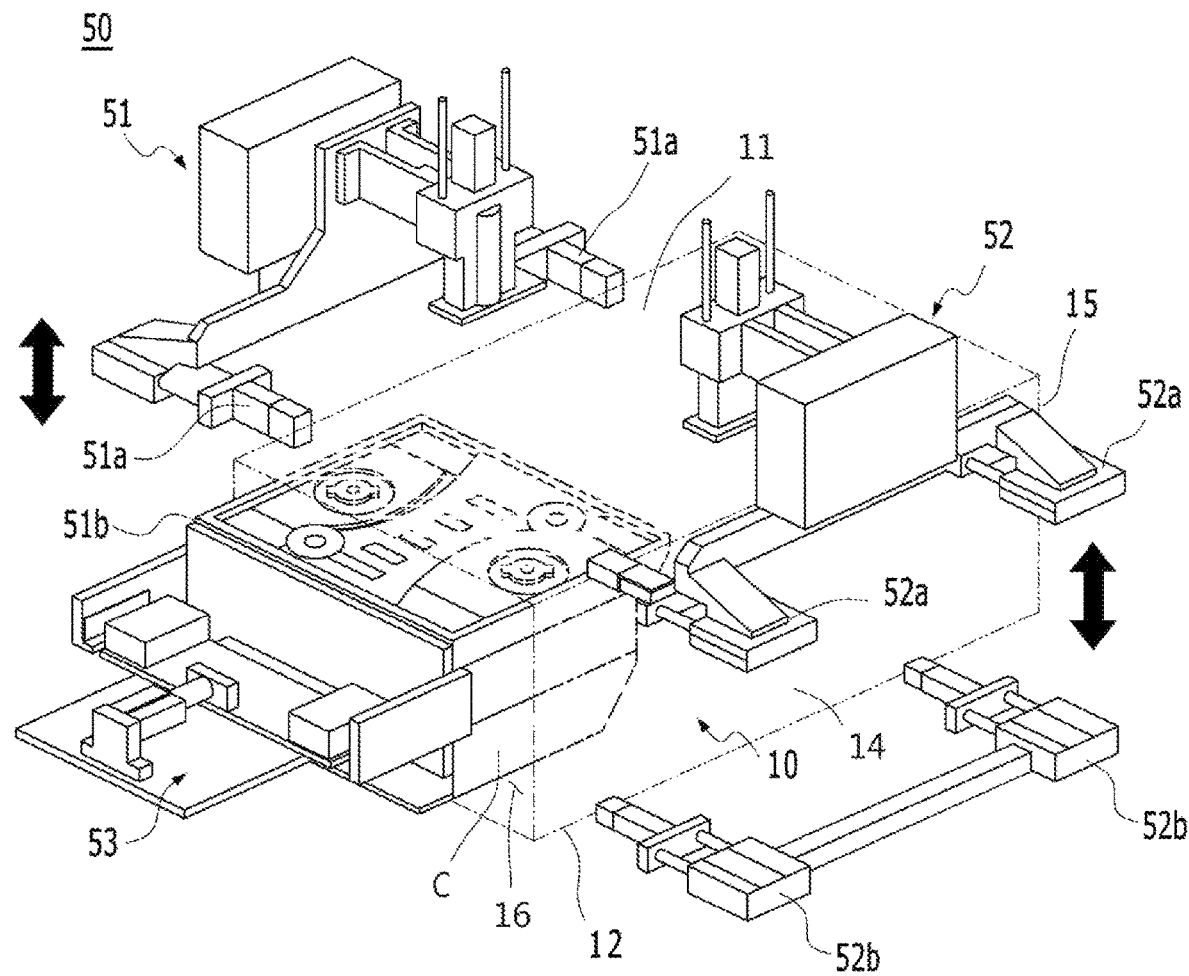

[FIG.5]
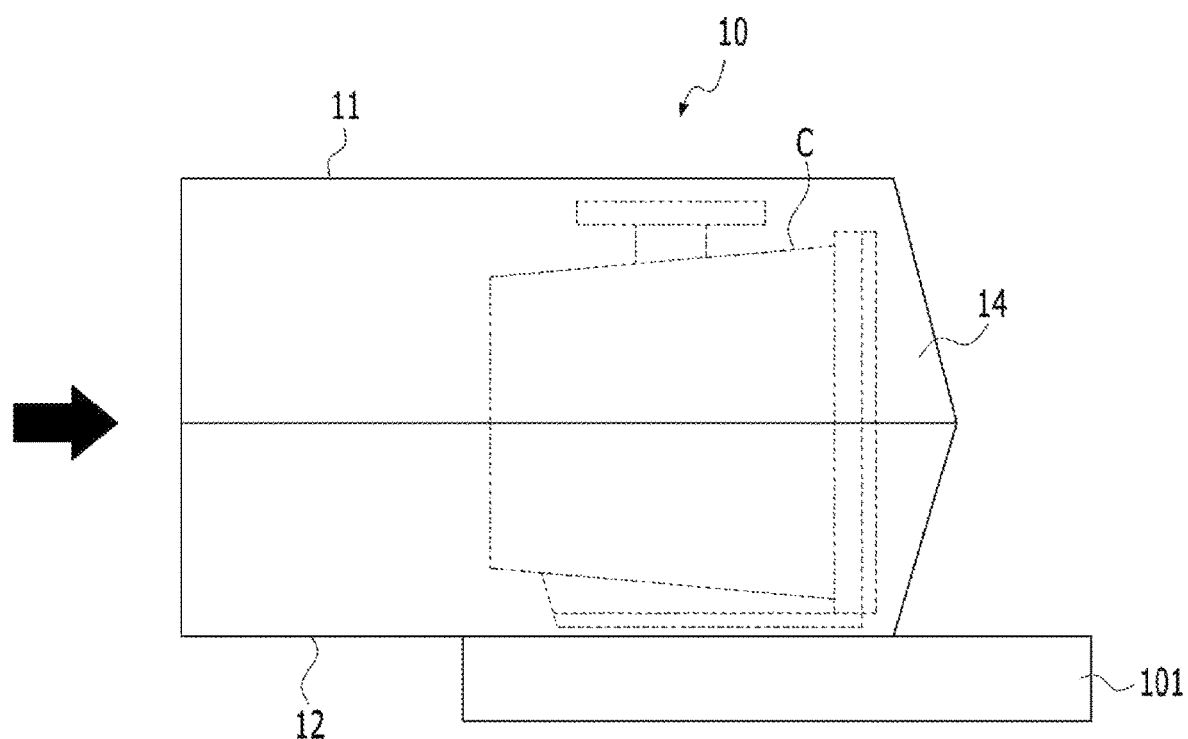

[FIG.6]
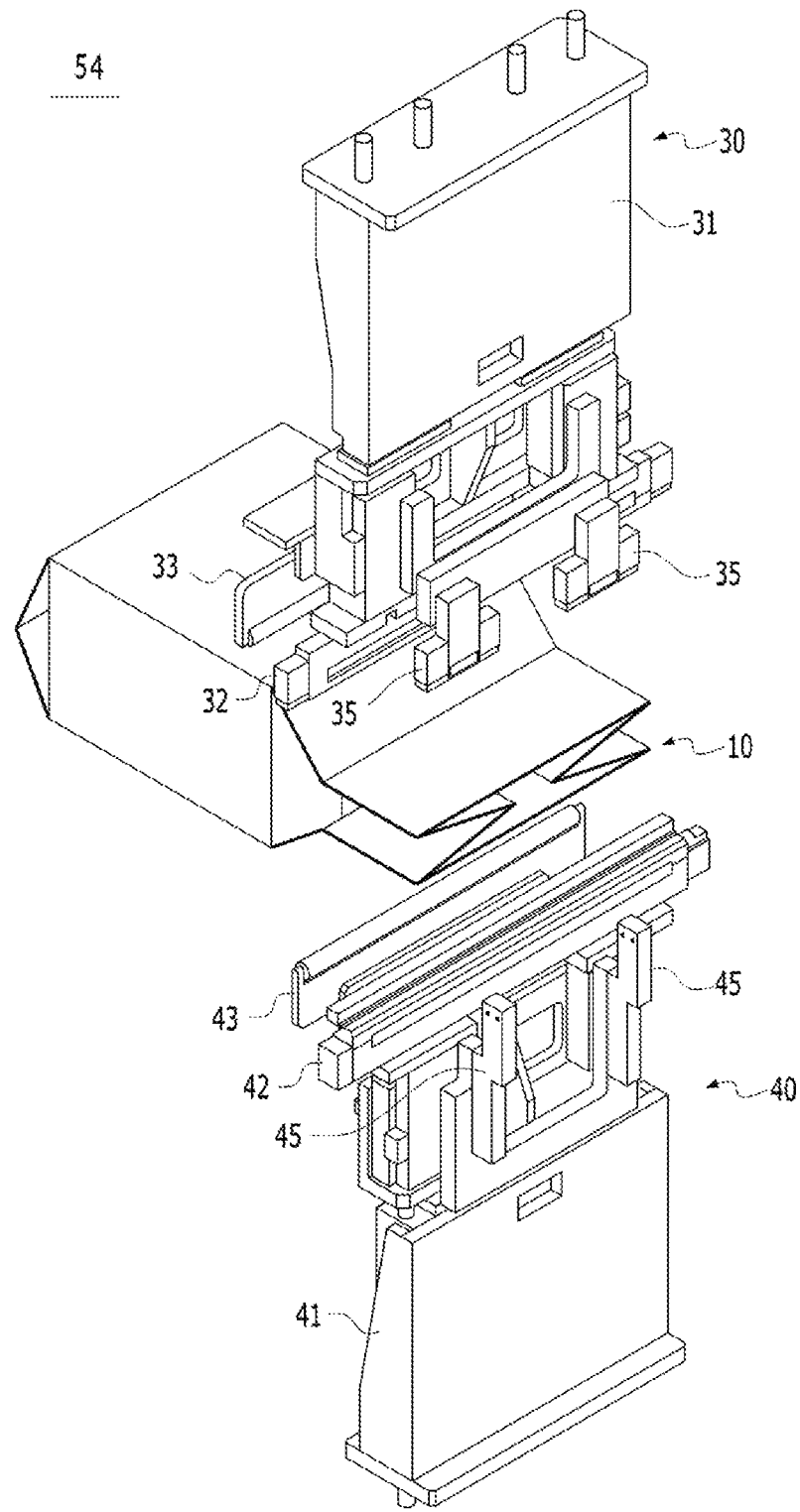

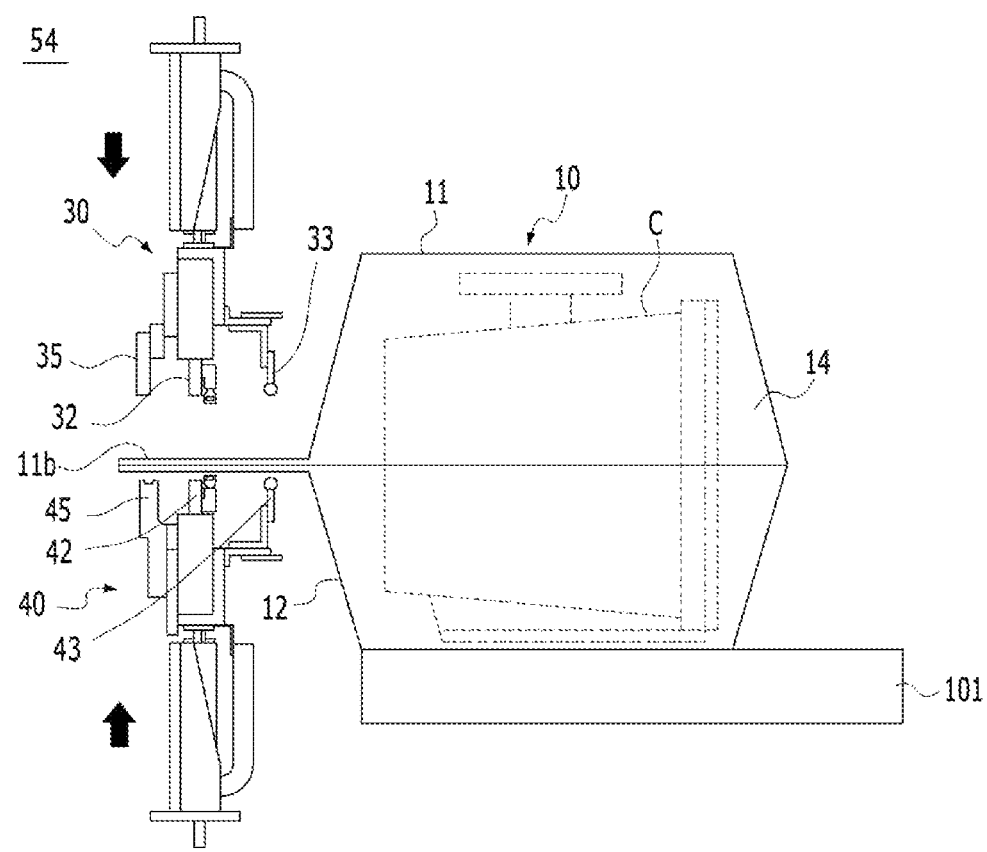
[FIG.7]

[FIG.8]
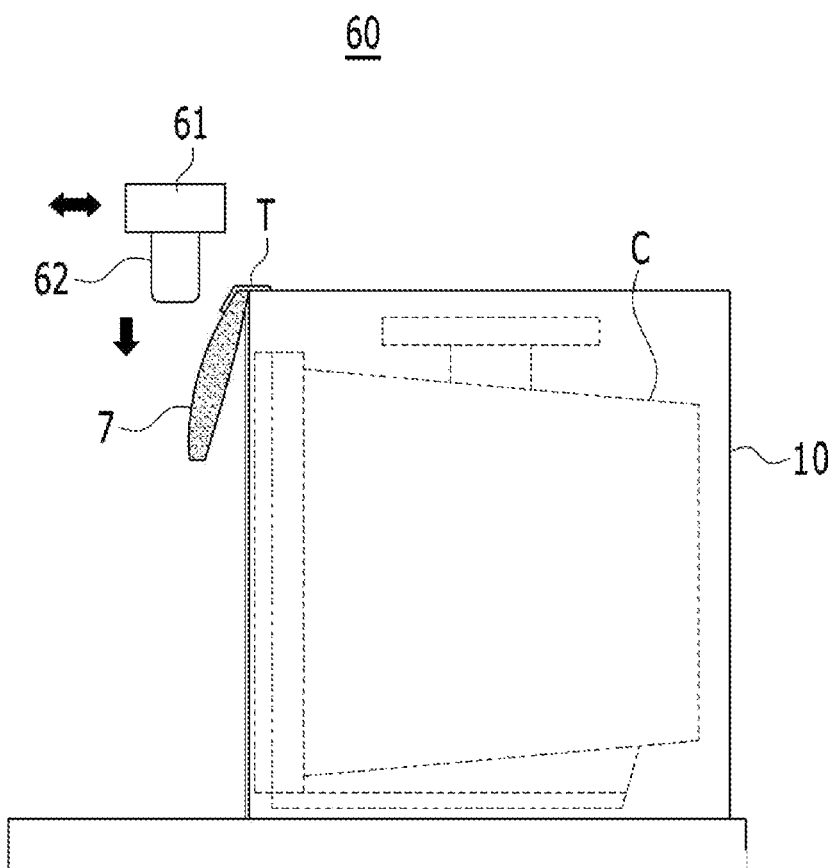

[FIG.9]
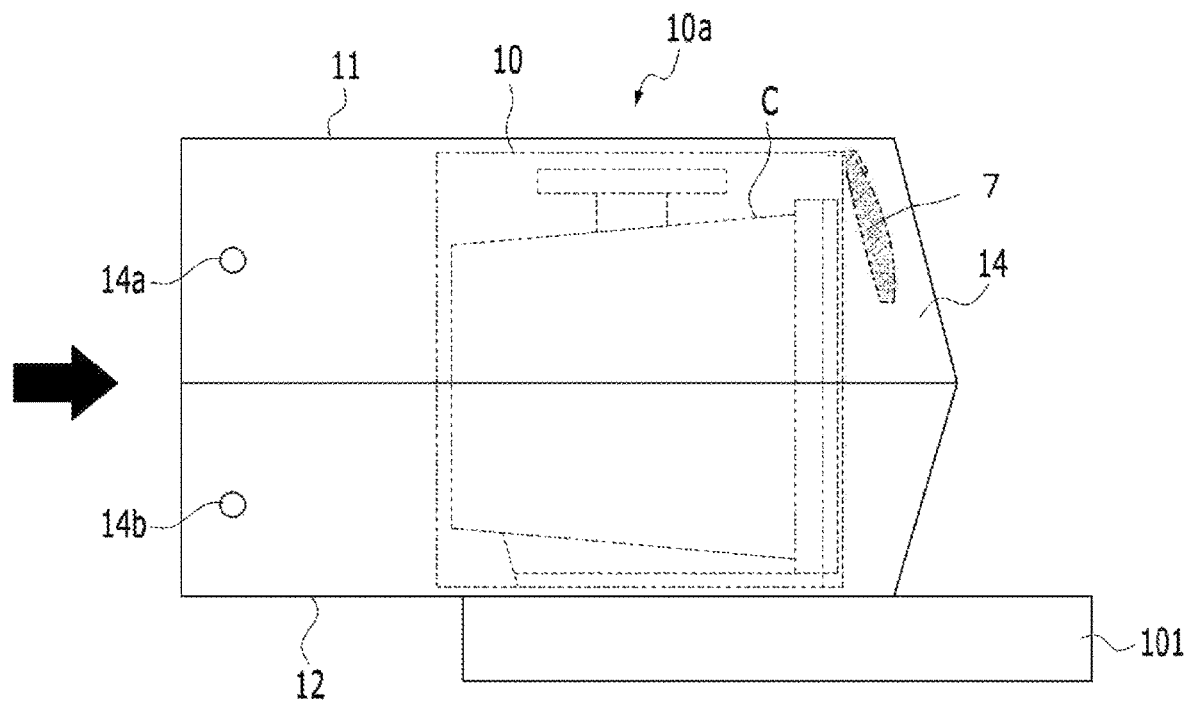

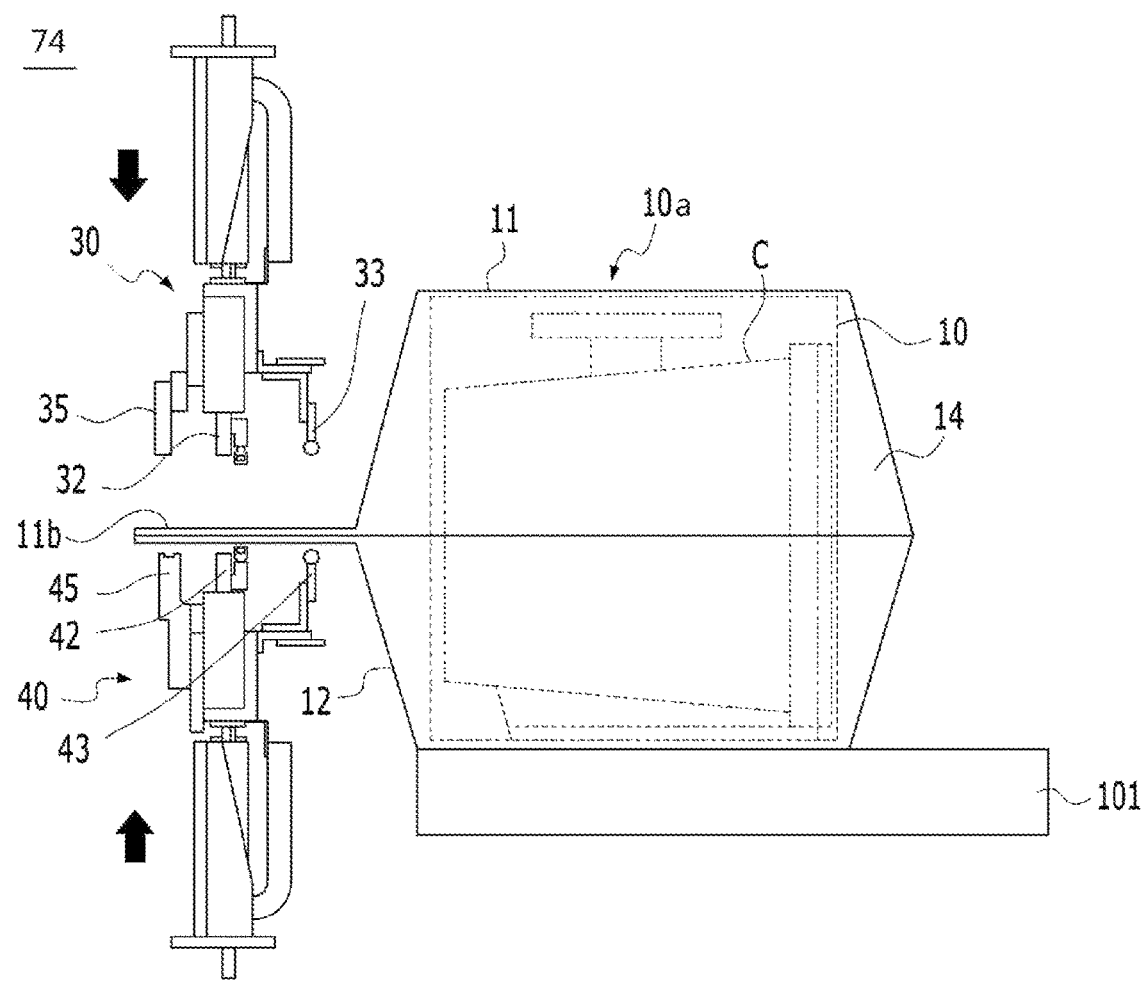
[FIG.10]

[FIG.11]
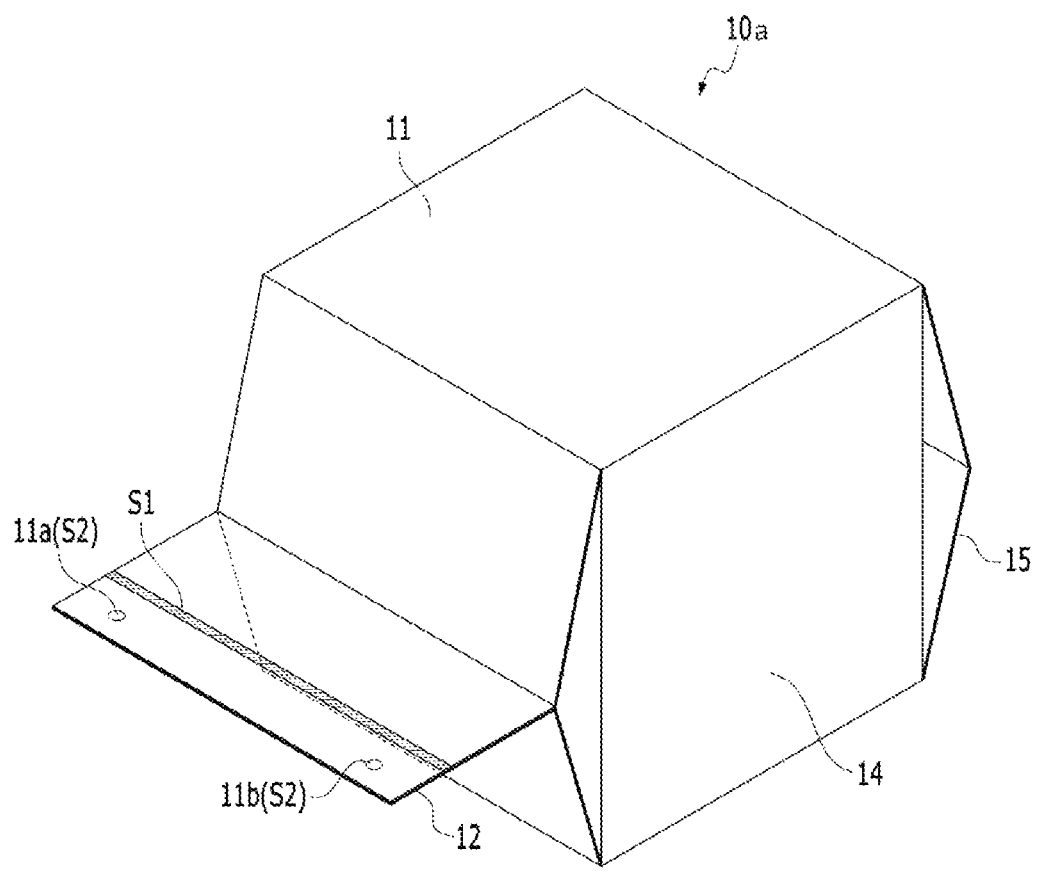

[FIG.12]
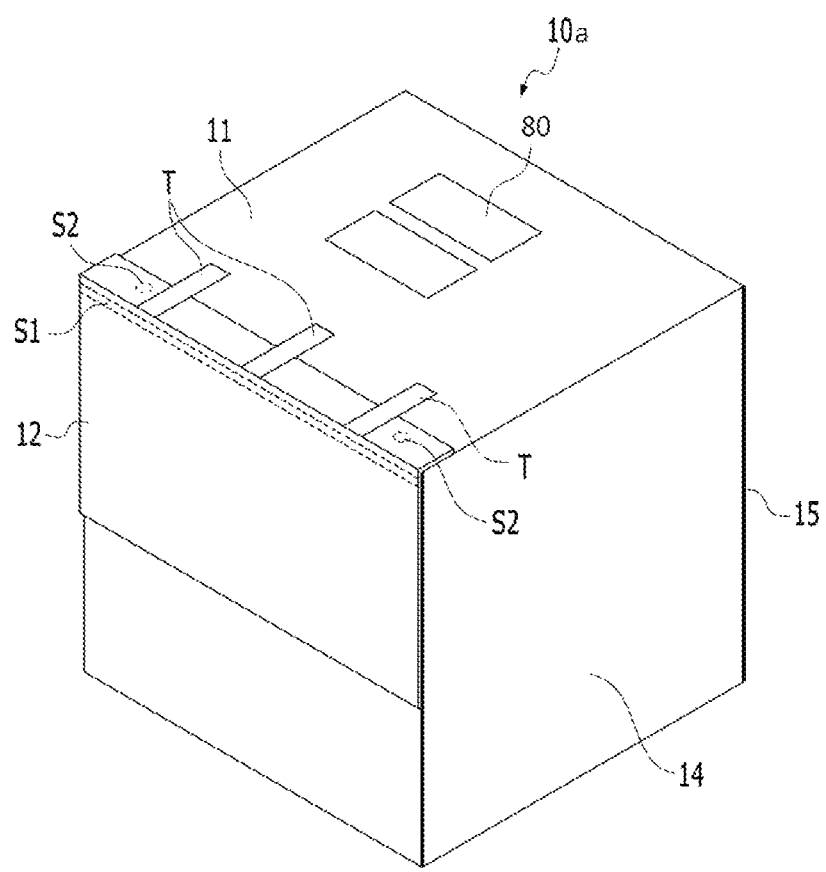

WAFER CASSETTE PACKING APPARATUS

CROSS-REFERENCE TO RELATED APPLICATION(S)

This application claims priority under 35 U.S.C. § 119 to Korean Patent Application No. 10-2019-0002634, filed on Jan. 9, 2019, which is hereby incorporated in its entirety by reference as if fully set forth herein.

TECHNICAL FIELD

The present invention relates to packing of a wafer cassette, and more particularly, to a packing apparatus for a wafer cassette capable of automatically packing a wafer cassette.

BACKGROUND

A wafer refers to a thin plate used as a raw material for a semiconductor integrated circuit (IC), and is mainly manufactured using a silicon material.

A fabricating process of a silicon wafer includes a single crystal growing process for fabricating a single crystal silicon ingot, a slicing process for obtaining a thin disk-shaped wafer by slicing a single crystal ingot, an edge grinding process for machining an outer circumferential portion of a wafer to prevent cracking and distortion of the wafer obtained by the slicing process, a lapping process for removing damages due to mechanical processing remaining on a wafer to improve flatness of the wafer, a polishing process for mirror-polishing a wafer, and a cleaning process for removing abrasive or foreign substances adhering to a wafer.

Wafers produced through such various processes are accommodated in a cassette such as a front open shipping box (FOSB) to prevent contamination and protect from external impact, and then are packed and shipped to be sealed from the outside using a packing film.

However, in the related art, as packing for a wafer cassette is manually performed, packing speed is very slow and packing quality is different depending on an operator. In addition, a packing film, a label to be attached, a packing method, and the like are different according to the type of the wafer cassette.

SUMMARY

Therefore, the present invention is directed to providing a wafer cassette packing apparatus capable of packing various kinds of wafer cassettes automatically and promptly and keeping the packing quality uniform and precise regardless of workers.

The present invention provides an apparatus for packing wafer cassettes, the apparatus including: a loading part to which a wafer cassette is loaded; an accessory inspection part configured to check a recipe attached to the wafer cassette and inspect accessories of the wafer cassette; a first label attaching part configured to attach a first label to the wafer cassette on which the accessory inspection has been completed; a primary film packing part configured to receive a primary film according to the recipe and pack the wafer cassette using the primary film; a secondary film packing part configured to receive a secondary film according to the recipe and secondarily pack the wafer cassette using the secondary film; a second label attaching part configured to attach a second label to the secondary film with which the wafer cassette has been packed; and an unloading part configured to discharge the wafer cassette which has been completely packaged.

The recipe may include at least one of a bar code and a quick response (QR) code.

The recipe may contain selection information on at least one of the primary film, the first label, the secondary film, the second label, a packing direction, and a packing method according to the kinds of wafer cassettes.

The accessory inspection part may include: a stage configured to rotate and support the wafer cassette; a camera configured to inspect the recipe attached to the wafer cassette and the accessories of the wafer cassette; and a robot diffraction arm configured to freely move the camera.

The apparatus may further include a first defective product discharge part configured to discharge a wafer cassette determined to be defective as a result of inspection by the accessory inspection part.

The apparatus may further include a packing inspection part configured to inspect a condition of the wafer cassette which has been packed by the secondary film packing part.

The apparatus may further include a second defective product discharge part configured to discharge a wafer cassette determined to be defective as a result of inspection by the packing inspection part.

The primary film packing part and the secondary film packing part may include a film packing device.

The film packing device may include: a film supply unit configured to supply a packing film; a film opening unit configured to open an opening of the packing film; a cassette inserting unit configured to insert a wafer cassette into the opening of the packing film; and a sealing unit configured to seal an edge of the packing film into which the wafer cassette has been inserted.

The apparatus may further include a drying agent attaching part configured to attach a drying agent on a surface of the primary film with which the wafer cassette has been packed.

The drying agent attaching part may include: a drying agent supply unit configured to supply a drying agent to one side of the wafer cassette which has been packed using the primary film; and a taping unit configured to attach the drying agent to the surface of the primary film using a tape.

The present invention provides an apparatus for packing wafer cassettes, the apparatus including: a loading part to which a plurality of wafer cassettes are loaded; an accessory inspection part configured to check recipes attached to the loaded wafer cassettes and inspect accessories of the wafer cassettes; a primary film packing part configured to receive a primary film according to the recipes read out by the accessory inspection part and pack the wafer cassettes using the primary film; and a secondary film packing part configured to receive a secondary film according to the recipes and secondarily pack the wafer cassettes using the secondary film.

The accessory inspection part may include: a stage configured to rotate and support the wafer cassettes; a camera configured to inspect the recipes attached to the wafer cassettes and the accessories of the wafer cassettes; and a robot diffraction arm configured to freely move the camera.

The present invention provides an apparatus for packing wafer cassettes, the apparatus including: a loading part to which a wafer cassette is loaded; a primary film packing part configured to receive a primary film and pack the wafer cassette using the primary film; a secondary film packing part configured to receive a secondary film and secondarily pack the wafer cassette using the secondary film; and an unloading part configured to discharge the wafer cassette which has been completely packaged.

The primary film packing part and the secondary film packing part may include a film packing device.

The film packing device may include: a film supply unit configured to supply a packing film; a film opening unit configured to open an opening of the packing film; a cassette inserting unit configured to insert a wafer cassette into the opening of the packing film; and a sealing unit configured to seal an edge of the packing film into which the wafer cassette has been inserted.

The present invention provides an apparatus for packing wafer cassettes, the apparatus including: a loading part to which a wafer cassette is loaded; a primary film packing part configured to receive a primary film and pack the wafer cassette using the primary film; a drying agent attaching part configured to attach a drying agent on a surface of the primary film with which the wafer cassette has been packed; a secondary film packing part configured to receive a secondary film and secondarily pack the wafer cassette using the secondary film; and an unloading part configured to discharge the wafer cassette which has been completely packaged.

The drying agent attaching part may include: a drying agent supply unit configured to supply a drying agent to one side of the wafer cassette which has been packed using the primary film; and a taping unit configured to attach the drying agent on a surface of the primary film using a tape.

The present invention provides an apparatus for packing wafer cassettes, the apparatus including: a film supply unit configured to supply a packing film; a film opening unit configured to open an opening of the packing film; a cassette inserting unit configured to insert a wafer cassette into the opening of the packing film; and a sealing unit configured to seal an edge of the packing film into which the wafer cassette has been inserted.

The present invention provides an apparatus for packing wafer cassettes, the apparatus performing a method including: attaching a first label to a wafer cassette according to a recipe attached to the wafer cassette; receiving a primary film and primarily packing the wafer cassette using the primary film; attaching a drying agent on a surface of the primary film with which the wafer cassette has been primarily packed; receiving a secondary film and secondarily packing the wafer cassette using the secondary film; attaching a second label to the secondary film; and discharging the wafer cassette which has been completely packaged.

BRIEF DESCRIPTION OF THE DRAWINGS

FIG. 1 is a block diagram of a wafer cassette packing apparatus according to one embodiment of the present invention.

FIG. 2 shows an embodiment of an accessory inspection part of FIG. 1.

FIG. 3 is a perspective view of wafer cassette packing films according to embodiments of the present invention.

FIG. 4 is a perspective view of a film packing device in a primary film packing part of FIG. 1.

FIG. 5 is a schematic side view showing a process of packing in which packing is performed using the film packing device of FIG. 4.

FIG. 6 is a perspective view of a sealing unit in the primary film packing part of FIG. 1.

FIG. 7 is a side view of FIG. 6.

FIG. 8 shows an embodiment of a drying agent attaching part of FIG. 1.

FIGS. 9 to 11 show operations of a secondary film packing part of FIG. 1.

FIG. 12 is a perspective view of a wafer cassette which has been completely packaged using a packing film according to an embodiment.

DETAILED DESCRIPTION OF THE EMBODIMENTS

Hereinafter, embodiments will be shown more apparent through the description of the appended drawings and embodiments. In the description of the embodiment, when it is described that each layer (film), region, pattern, or structure is formed "above/on" or "below/under" a substrate, each layer (film), region, pad or pattern, the description includes being formed both "directly" or "indirectly (by interposing another layer)" "above/on" and "below/under". Also, a standard of above/on or below/under of each layer will be described with respect to the drawings.

Areas in the drawings may be exaggerated, omitted, or schematically described for a convenient and precise description. In addition, the size of each component does not fully match the actual size thereof. Further, like reference numbers represent like elements through description of the drawings. Hereinafter, an embodiment will be described with reference to the accompanying drawings.

FIG. 1 is a block diagram of a wafer cassette packing apparatus according to an embodiment of the present invention.

Referring to FIG. 1, a wafer cassette packing apparatus 1 according to an embodiment may include a loading part 100, an accessory inspection part 200, a first label attaching part 300, a first defective product discharge part 400, a primary film packing part 500, a drying agent attaching part 600, a secondary film packing part 700, a packing inspection part 750, a second label attaching part 800, a second defective product discharge part 900, and an unloading part 1000.

A wafer cassette C (see FIG. 2) configured to accommodate a plurality of wafers may be loaded to the loading part 100. For example, the wafer cassette C may be a front open shipping box (FOSB), and a plurality of wafer cassettes C having various sizes and shapes may stand by and be sequentially loaded one by one to the loading part 100.

The loading part 100 may include means for conveying the wafer cassettes C, such as a conveyor belt and a robot arm, and have a space in which the plurality of wafer cassettes C may stand by in a row. The loading part 100 may perform communication with each configuration inside the apparatus via a manufacturing execution system (MES). That is, the MES is an integrated management system for managing the overall process for packing wafer cassettes and enables close communication between the elements of the wafer cassette packing apparatus 1.

The wafer cassette packing apparatus 1 of the present invention may perform packing as the wafer cassettes C of the same shape are sequentially loaded into the apparatus from the loading part 100. Even when various wafer cassettes C are randomly loaded from the loading part 100, the wafer cassette packing apparatus 1 may perform packing corresponding to each wafer cassette C.

To this end, a recipe may be attached to the wafer cassette C loaded from the loading part 100. Here, the recipe may be a tag containing selection information on a primary film 10 (see FIG. 3), a first label, a secondary film 10a (see FIG. 3), a second label 80 (see FIG. 12), a packing method, a packing direction, and the like. For example, the recipe may include at least one of a bar code and a quick response (QR) code and be attached to one surface of the wafer cassette C.

Therefore, the information contained in the recipe may be read out by a reader device. The wafer cassette packing apparatus 1 may include a reader device capable of reading out information of the recipe, select the packing films 10 and 10a, the labels, and the like and select a packing direction, a packing method, and the like according to the read-out information of the recipe, and automatically perform packing of the wafer cassette C.

The accessory inspection part 200 may check the recipe attached to the wafer cassette C and inspect accessories of the wafer cassette C. Here, the accessory inspection may be used as a term that encompasses all inspections for inspecting exterior conditions of the wafer cassette C such as conditions of a handle, a flange, and hole blockage of the wafer cassette C and interior conditions of the wafer cassette C such as the exact number of wafers accommodated in the wafer cassette C and whether the wafers are aligned at correct positions.

FIG. 2 shows an embodiment of the accessory inspection part of FIG. 1.

Referring to FIG. 2, the accessory inspection part 200 may include an accessory inspection unit 20 which includes a stage 21 configured to rotate and support the wafer cassette C, a camera 22 having a reader device configured to inspect the recipe attached to the wafer cassette C and the accessories of the wafer cassette C, a robot diffraction arm 23 configured to freely move the camera 22, and a driver 25 configured to drive the robot diffraction arm 23.

When the condition of the wafer cassette C is determined as normal as a result of inspection by the accessory inspection part 200, a first label corresponding to the recipe is attached to the wafer cassette C, and the packing process is continued. However, when the wafer cassette C is determined as abnormal as a result of inspection by the accessory inspection part 200, the wafer cassette C is discharged to the first defective product discharge part 400 without attaching the first label to the wafer cassette C and packing the wafer cassette C.

The first label attaching part 300 may attach the first label to the wafer cassette C on which the accessory inspection has been completed and which has been determined as normal. The first label may include indication of various pieces of information on the wafers accommodated in the wafer cassette C and be attached to one surface of the wafer cassette C.

The primary film packing part 500 may perform primary packing of the wafer cassette C to which the first label has been attached. Here, the primary film packing part 500 may receive the primary film 10 according to the recipe and primarily pack the wafer cassette C using the primary film 10.

FIG. 3 shows perspective views of wafer cassette packing films according to embodiments of the present invention. As illustrated in FIG. 3, the wafer cassette packing films 10 and 10a may include the primary film 10 and the secondary film 10a and may package the wafer cassette C in double layers.

Referring to FIG. 3A, the primary film 10 according to an embodiment may include an upper surface sheet 11, a lower surface sheet 12, and a pair of side surface sheets 13 and 14.

The upper surface sheet 11 and the lower surface sheet 12 may surround an upper surface and a lower surface of the wafer cassette C (see FIG. 4), and the pair of side surface sheets 13 and 14 may surround both side surfaces of the wafer cassette C. For example, the upper surface sheet 11, the lower surface sheet 12, and the side surface sheets 13 and 14 may have a rectangular shape.

Here, the pair of side surface sheets 13 and 14 may extend from side surfaces of the upper surface sheet 11 and the lower surface sheet 12 and may be folded inward or unfolded. That is, one side of the upper surface sheet 11, the lower surface sheet 12, and the pair of side surface sheets 13 and 14 may be joined to each other and form a closed portion 15, and the other sides thereof may form an opening 16 as the side surface sheets 13 and 14 are unfolded.

Therefore, the primary film 10 may be transported into the primary film packing part 500 while being folded and may accommodate the wafer cassette C therein while being unfolded. Also, while the wafer cassette C is accommodated inside the primary film 10, the primary film 10 may be folded again so that an edge area of the primary film 10 is sealed.

Also, as illustrated in FIG. 3B, the secondary film 10a may, unlike the primary film 10, include first holes 13a and 14a and second holes 13b and 14b respectively formed in the pair of side surface sheets 13 and 14 so as to communicate with each other when the secondary film 10a is folded. Here, the first holes 13a and 14a and the second holes 13b and 14b are disposed adjacent to the opening 16 of the packing film 10 so that secondary sealing, which will be described below, is facilitated.

The films illustrated in FIGS. 3A and 3B may all be used as the primary film or the secondary film, and other types of films may also be used as the primary film or the secondary film.

The above-described primary film 10 and secondary film 10a may include at least one material among a polyethylene terephthalate (PET) film, an oriented polypropylene (OPP) film, a polyethylene (PE) film, a polypropylene (PP) film, and a linear low density polyethylene (LLDPE) film.

Also, a surface of the packing film may be laminated. The laminated film may have a glossy surface and be better protected and preserved. Also, the surface of the packing film may be coated with aluminum.

Generally, the primary film 10 is referred to as a laminate film because the surface of the primary film 10 is laminated, and the secondary film 10a is referred to as an aluminum film because the surface of the secondary film 10a is coated with opaque aluminum. In addition, the above-described primary film and secondary film may be referred to as an inner packing film and an outer packing film, respectively, or may be collectively referred to as the wafer cassette packing films or the like.

The primary film packing part 500 may primarily package the wafer cassette C using the above-described primary film 10. The primary film packing part 500 may package the wafer cassette C by selecting and applying the primary film 10, a packing position (direction), a packing method, a sealing method, and the like of the wafer cassette C which are suitable for the recipe.

To this end, the primary film packing part 500 may include a film packing device 50. The film packing device 50 may also be included in the secondary film packing part 700, which will be described below, that is configured to perform packing using the secondary film 10a.

FIG. 4 is a perspective view of the film packing device in the primary film packing part of FIG. 1. FIG. 5 is a schematic side view showing a process in which packing is performed using the film packing device of FIG. 4. FIG. 6 is a perspective view of a sealing unit in the primary film packing part of FIG. 1. FIG. 7 is a side view of FIG. 6.

As illustrated in FIGS. 4 to 7, the film packing device 50 may include a film supply unit (not illustrated), film opening units 51 and 52, a cassette inserting unit 53, and a sealing unit 54.

Although not illustrated, the film supply unit may include a space in which a plurality of primary films 10 are stacked and may separately supply a single primary film 10 to positions of the film opening units 51 and 52 of the primary film packing part 500.

The film opening units 51 and 52 may lift the upper surface sheet 11 of the primary film 10, which is in a folded state, and open the opening 16. For example, the film opening units 51 and 52 may be a pair so that a single film opening unit is disposed at both side surface sheets 13 and 14.

Referring to FIG. 4, the film opening units 51 and 52 may respectively include a pair of upper surface grippers 51a and 52a configured to grip and lift the upper surface sheet 11 and a pair of lower surface grippers 51b and 52b configured to grip and fix the lower surface sheet 12.

The upper surface grippers 51a and 52a may be disposed as a pair at positions adjacent to the opening 16 and the closed portion 15 of the upper surface sheet 11 and grip the upper surface sheet 11 (more specifically, a corner area between the upper surface sheet 11 and the side surface sheets 13 and 14) and may operate to be lifted and lowered from and to the lower surface grippers 51b and 52b.

The lower surface grippers 51b and 52b may be disposed as a pair at positions adjacent to the opening 16 and the closed portion 15 of the lower surface sheet 12 and grip the lower surface sheet 12 (more specifically, a corner area between the lower surface sheet 12 and the side surface sheets 13 and 14) and may approach or be spaced apart from the upper surface grippers 51a and 52a at positions corresponding to the pair of upper surface grippers 51a and 52a.

When the upper surface grippers 51a and 52a are lifted from the lower surface grippers 51b and 52b while the upper surface grippers 51a and 52a are gripping the upper surface sheet 11 of the primary film 10 as illustrated in FIG. 4, the opening 16 of the primary film 10 may be opened.

The cassette inserting unit 53 may receive the wafer cassette C, which has moved from the first label attaching part 300, and insert the wafer cassette C into the primary film 10 which has been opened by the primary film packing part 500. That is, while operating in the horizontal direction, the cassette inserting unit 53 may introduce the wafer cassette C into the primary film 10 as illustrated in FIG. 5 via the opening 16 of the primary film 10 that has been opened by the film opening units 51 and 52.

When the wafer cassette C is inserted into the primary film 10, the sealing unit 54 may seal the edge area of the primary film 10, into which the wafer cassette C has been inserted, so that the primary film 10 is sealed from the outside.

As illustrated in FIGS. 6 and 7, the sealing unit 54 may include an upper sealing unit 30 and a lower sealing unit 40. Here, the upper sealing unit 30 may be disposed at an upper portion of the packing film 10 at which sealing is performed, and the lower sealing unit 40 may be disposed at a lower portion of the packing film 10.

The sealing unit 54 may simultaneously perform double-structured sealing, i.e., linear-type primary sealing and point-type secondary sealing. Of course, the sealing unit 54 may perform only the primary sealing or the secondary sealing as necessary or may sequentially perform the primary sealing and the secondary sealing instead of simultaneously performing the two.

More specifically, the upper sealing unit 30 may include an upper main body 31, a linear-type welding part 32, an upper surface pressing bar 33, and a point-type welding part 35.

The upper main body 31 may allow the above-described linear-type welding part 32, upper surface pressing bar 33, and point-type welding part 35 to be supported at a lower portion, and, although not illustrated, the upper main body 31 may be lowered toward the lower sealing unit 40 by a lifting/lowering movement part, thereby performing the primary sealing and secondary sealing on the packing film 10.

The linear-type welding part 32 may be formed in a linear bar shape and may weld the upper surface sheet 11 in a linear shape so that the upper surface sheet 11 is bonded to the lower surface sheet 12, thereby performing the primary sealing.

The upper surface pressing bar 33 may press the upper surface sheet 11 in a linear shape, adhere the upper surface sheet 11 to the lower surface sheet 12, and align the sheets to each other, thereby allowing the primary sealing and secondary sealing to be performed stably and uniformly.

The point-type welding part 35 may be formed as a pair and installed to be movable on the upper surface sheet 11. The point-type welding part 35 may perform the secondary sealing. Here, the linear-type welding part 32 may be disposed between the upper surface pressing bar 33 and the point-type welding part 35.

Therefore, the primary sealing may be performed at an area of the primary film 10 that is disposed at an inner side, and the secondary sealing may be performed at the edge area of the primary film 10 that is disposed at an outer side.

The lower sealing unit 40 may include a lower main body 41, a linear-type support bar 42, a lower surface support bar 43, and a point-type support bar 45, as configurations respectively corresponding to those of the upper sealing unit 30 described above.

The lower main body 41 may allow the above-described linear-type support bar 42, lower surface support bar 43, and point-type support bar 45 to be supported at an upper portion and may interact with the upper sealing unit 30, thereby performing the primary sealing and secondary sealing on the packing film 10. Also, the lower main body 41 may move toward the upper sealing unit 30 by the lifting/lowering movement part.

The linear-type support bar 42 may be formed in a linear bar shape, support the lower surface sheet 12, and interact with the linear-type welding part 32 of the upper sealing unit 30 so that the upper surface sheet 11, the side surface sheets 13 and 14, and the lower surface sheet 12 are bonded to one another, thereby performing the primary sealing.

The lower surface support bar 43 supports the lower surface sheet 12 in a linear shape, adheres the upper surface sheet 11 and the lower surface sheet 12 to each other together with the upper surface pressing bar of the upper sealing unit 30, and aligns the sheets to each other, thereby allowing the primary sealing and secondary sealing to be performed stably and uniformly.

The point-type support bar 45 may be formed as a pair and support the lower surface sheet 12 in a point shape. Therefore, the point-type support bar 45 may interact with the point-type welding part 35 of the upper sealing unit 30, thereby performing the secondary sealing.

Here, the linear-type support bar 42 may be disposed between the lower surface support bar 43 and the point-type support bar 45. Therefore, the primary sealing may be performed at an area of the packing film 10 that is disposed at an inner side, and the secondary sealing may be performed at the edge area of the packing film 10 that is disposed at an outer side.

The wafer cassette C, which has been packed by the film packing device 50 using the primary film 10 as described above, may move to the drying agent attaching part 600.

The drying agent attaching part 600 may attach a drying agent on a surface of the primary film 10 of the packed wafer cassette C. The drying agent serves to remove moisture in order to prevent moisture from being generated in the packaged wafer cassette C. The drying agent may be referred to as desiccant, moisture removing agent, silica gel, or the like.

FIG. 8 shows an embodiment of the drying agent attaching part of FIG. 1.

As schematically illustrated in FIG. 8, the drying agent attaching part 600 may include a drying agent attaching unit 60 which includes a drying agent supply unit 61 configured to grip a drying agent 7 and move the drying agent 7 to one side of the wafer cassette C and a taping unit 62 configured to attach the drying agent 7 on a surface of the primary film 10 using a tape T.

Since the drying agent 7 is stably attached on the surface of the primary film 10 using the tape T by the drying agent attaching part 600 as described above, the secondary film packing part 700 may smoothly perform packing using the secondary film 10a, and the drying agent 7 may be fixed in position without moving between the primary film 10 and the secondary film 10a.

The wafer cassette C to which the drying agent 7 has been attached may move to the secondary film packing part 700.

The secondary film packing part 700 may receive the secondary film 10a according to the recipe and secondarily pack the wafer cassette C. The secondary film packing part 700 may package the wafer cassette C by selecting and applying the secondary film 10a, a packing position (direction), a packing method, a sealing method, and the like of the wafer cassette C which are suitable for the recipe.

The secondary film packing part 700 may include the film packing device 50 used in the above-described primary film packing part 500. That is, as illustrated in FIGS. 4 to 7, the film packing device 50 in the secondary film packing part 700 may include the film supply unit (not illustrated), the film opening units 51 and 52, the cassette inserting unit 53, and the sealing unit 54. Therefore, detailed description of the film packing device 50 will be omitted.

FIGS. 9 to 11 show operations of the secondary film packing part of FIG. 1, and FIG. 12 is a perspective view of the wafer cassette C which has been completely packaged using a packing film according to an embodiment.

Referring to FIGS. 9 to 12, the secondary film packing part 700 may secondarily package the wafer cassette C by using an aluminum film 10a illustrated in FIG. 3B, that has the pair of first holes 13a and 14a and the pair of second holes 13b and 14b formed therein, as the secondary film 10a.

In this case, for the primary sealing, since sealing is linearly performed while the side surface sheets 13 and 14 are folded, sealing should be performed so that all the four sheets are bonded at portions at which the side surface sheets 13 and 14 are folded. Therefore, since sealing may not be performed well at sites where the sheets are folded in the primary sealing process, edges of the secondary film 10a may be further prevented from coming off by the secondary sealing on the portions at which the sheets are folded.

As illustrated in FIG. 11, primary sealing S1 may be performed in a linear elongated shape on the secondary film 10a, and secondary sealing S2 may be performed on the secondary film 10a so that, as the pair of side surface sheets 13 and 14 are folded such that the first holes 13a and 14a and the second holes 13b and 14b come into communication with each other, areas of the upper surface sheet 11 and the lower surface sheet 12 which are adjacent to the first holes 13a and 14a and the second holes 13b and 14b are bonded to each other in a point shape. That is, due to the first holes 13a and 14a and the second holes 13b and 14b, the secondary sealing S2 may be performed using only two sheets.

When sealing of the secondary film 10a is completed as described above, the sealed edge area is finished using the tape T so as to come into contact with the upper surface sheet 11 of the secondary film 10a as illustrated in FIG. 12. In the present embodiment, by sealing edges of the packing films 10 and 10a in double layers by the primary sealing S1 and the secondary sealing S2 and finally finishing the edge area using the tape T on the upper surface sheet 11, it is possible to uniformly finish the packing films 10 and 10a while preventing the packing films 10 and 10a from coming off.

The wafer cassette C which has been packed using the secondary film 10a as described above may move to the packing inspection part 750, and a packing condition of the wafer cassette C may be inspected. The packing inspection part 750 may include the camera 22 like the above-described accessory inspection part 200 and perform a vision inspection.

The wafer cassette C which has been determined as normal by the packing inspection part 750 moves to the second label attaching part 800. The second label attaching part 800 may attach the second label 80 to the wafer cassette C which has been completely double-packed using the primary and secondary films 10 and 10a.

The second label 80 is attached to a surface of the secondary film 10a in a state in which the wafer cassette C is not visible with the naked eye. In this way, the second label 80 allows various types of information on wafers accommodated in the wafer cassette C to be recognized without unpacking the wafer cassette C.

The wafer cassette C which has been determined as abnormal by the packing inspection part 750 may be discharged to the second defective product discharge part 900 without attaching the second label 80 to the waver cassette C.

The wafer cassette C which has been completely packaged and to which the second label has been attached may be discharged to the outside from the unloading part 1000 and then be finally shipped.

According to the wafer cassette packing apparatus of the present invention, a packing process for various kinds of wafer cassettes can be automatically and promptly performed in stages, and the packaged wafer cassettes can be finished uniformly without causing edges of a packing film to come off. In this way, the packing quality can be kept uniform and precise regardless of workers.

The features, structures, effects and the like described in the embodiments are included in at least one embodiment of the present invention and are not necessarily limited to only one embodiment. Furthermore, the features, structures, effects and the like illustrated in the embodiments may be combined or modified with other embodiments by those skilled in the art to which the embodiments belong. Accordingly, it is to be understood that such combination and modification are included in the scope of the present invention.

DESCRIPTION OF REFERENCE NUMERALS

| | | | |
|---|---|---|---|
| 1: | wafer cassette packing apparatus | | |
| 10, 10a: | wafer cassette packing film | 11: | upper surface sheet |
| 11, 11a: | point type sealing region | 12: | lower surface sheet |
| 13, 14: | side surface sheet | 13a, 14a: | first hole |
| 13b, 14b: | second hole | 15: | junction region (closed portion) |
| 16: | opening | C: | wafer cassette |
| 20: | accessory inspection unit | 21: | rotating stage |
| 22: | reader device | 23: | robot arm |
| 25: | robot arm driver | 30: | upper sealing unit |
| 31: | upper main body | 33: | linear-type welding part |
| 33: | upper surface pressing bar | 35: | point-type welding part |
| 40: | lower sealing unit | 41: | lower main body |
| 42: | linear-type support bar | 43: | lower surface support bar |
| 45: | point-type support bar | 50: | film packing device |
| 51, 52: | film opening unit | 53: | cassette inserting unit |
| 54, 74: | sealing unit | 60: | drying agent attaching unit |
| 61: | drying agent gripping part | 62: | taping part |
| S1: | linear-type sealing region | S2: | point-type sealing region |
| 100: | loading part | 200: | accessory inspection part |
| 300: | first label attaching part | 400: | first defective product discharge part |
| 500: | primary film packing part | 600: | drying agent attaching part |
| 700: | secondary film packing part | 750: | packing inspection part |
| 800: | second label attaching part | 900: | second defective product discharge part |
| 1000: | unloading part | | |

What is claimed is:

1. An apparatus for packing wafer cassette, the apparatus comprising:
a loading part to which a wafer cassette is loaded;
an accessory inspection part configured to check a recipe attached to the wafer cassette and inspect accessories of the wafer cassette;
a first label attaching part configured to attach a first label to the wafer cassette on which the accessory inspection has been completed;
a primary film packing part configured to receive a primary film according to the recipe and pack the wafer cassette using the primary film;
a secondary film packing part configured to receive a secondary film according to the recipe and secondarily pack the wafer cassette using the secondary film;
a second label attaching part configured to attach a second label to the secondary film with which the wafer cassette has been packed;
an unloading part configured to discharge the wafer cassette which has been completely packaged;
a first defective product discharge part configured to discharge the wafer cassette determined to be defective as a result of inspection by the accessory inspection part;
a packing inspection part configured to inspect a condition of the wafer cassette which has been packed by the secondary film packing part; and
a second defective product discharge part configured to discharge the wafer cassette determined to be defective as a result of inspection by the packing inspection part,
wherein each of the accessory inspection part and the packing inspection part includes a camera and performs a vision inspection,
wherein the wafer cassette determined as normal by the packing inspection part is moved to the second label attaching part, and
wherein the second label attaching part attaches the second label to the wafer cassette which is completely double-packed using the primary film and the secondary film.

2. The apparatus of claim 1, wherein the recipe includes at least one of a bar code and a quick response (QR) code.

3. The apparatus of claim 2, wherein the recipe contains selection information on at least one of the primary film, the first label, the secondary film, the second label, a packing direction, and a packing method according to the kinds of wafer cassettes.

4. The apparatus of claim 3, wherein the accessory inspection part comprises:
a stage configured to rotate and support the wafer cassette;
the camera configured to inspect the recipe attached to the wafer cassette and the accessories of the wafer cassette; and
a robot diffraction arm configured to freely move the camera.

5. The apparatus of claim 1, wherein the primary film packing part and the secondary film packing part include a film packing device.

6. The apparatus of claim 5, wherein the film packing device comprises:
a film supply unit configured to supply a packing film;
a film opening unit configured to open an opening of the packing film;
a cassette inserting unit configured to insert a wafer cassette into the opening of the packing film; and
a sealing unit configured to seal an edge of the packing film into which the wafer cassette has been inserted.

7. The apparatus of claim 1, further comprising a drying agent attaching part configured to attach a drying agent on a surface of the primary film with which the wafer cassette has been packed.

8. The apparatus of claim 7, wherein the drying agent attaching part comprises:
a drying agent supply unit configured to supply a drying agent to one side of the wafer cassette which has been packed using the primary film; and
a taping unit configured to attach the drying agent to the surface of the primary film using a tape.

* * * * *